(12) United States Patent
Hucker et al.

(10) Patent No.: US 7,942,994 B2
(45) Date of Patent: May 17, 2011

(54) BONDING TOOL AND METHOD

(75) Inventors: Martyn John Hucker, Cleeve (GB);
Clyde Warsop, Lydney (GB)

(73) Assignee: Bae Systems PLC, London (GB)

( * ) Notice: Subject to any disclaimer, the term of this patent is extended or adjusted under 35 U.S.C. 154(b) by 920 days.

(21) Appl. No.: 11/815,875

(22) PCT Filed: May 23, 2007

(86) PCT No.: PCT/GB2007/050289
§ 371 (c)(1),
(2), (4) Date: Aug. 9, 2007

(87) PCT Pub. No.: WO2007/138346
PCT Pub. Date: Dec. 6, 2007

(65) Prior Publication Data
US 2010/0139860 A1  Jun. 10, 2010

(30) Foreign Application Priority Data

May 27, 2006 (EP) .................................... 06252773
May 27, 2006 (GB) .................................... 0610619.9

(51) Int. Cl.
*B32B 37/00* (2006.01)
(52) U.S. Cl. ....................................... 156/160; 156/281
(58) Field of Classification Search ................. 156/160, 156/60, 153, 281
See application file for complete search history.

(56) References Cited

U.S. PATENT DOCUMENTS

| | | | | |
|---|---|---|---|---|
| 4,883,215 A | * | 11/1989 | Goesele et al. | 438/455 |
| 5,849,125 A | * | 12/1998 | Clark | 156/222 |
| 6,008,113 A | * | 12/1999 | Ismail et al. | 438/615 |
| 6,030,480 A | * | 2/2000 | Face et al. | 156/160 |
| 2003/0048040 A1 | * | 3/2003 | Dollgast | 310/328 |
| 2004/0154730 A1 | | 8/2004 | Clingman et al. | |

FOREIGN PATENT DOCUMENTS

| | | |
|---|---|---|
| EP | 1 263 060 A2 | 12/2002 |
| GB | 0 420 293 | 9/2004 |
| GB | 0505628 | 3/2005 |
| WO | 2006/027630 A2 | 3/2006 |
| WO | 2006/097522 A1 | 9/2006 |

OTHER PUBLICATIONS (2) European Search Reports of EP 06 25 2773 dated Nov. 9, 2006 and Jan. 8, 2007.
F. Niklaus et al., "Low Temperature Full Wafer Adhesive Bonding of Structured Wafers", Sensors and Actuators A, 2001, vol. 92, pp. 235-241, Elsevier science B.V.

* cited by examiner

*Primary Examiner* — Jeff H Aftergut
(74) *Attorney, Agent, or Firm* — Buchanan Ingersoll & Rooney PC

(57) ABSTRACT

A bonding tool and method A bonding tool and method for bonding together layers of a MEMS transducer device, including at least one layer of a piezoelectric material, and an intermediate reinforcing layer of titanium, or other metal, comprising: positioning the layers above one another and spaced apart by means of spacing members, heating said layers to a bonding temperature, and retracting the spacing members so as to bring the layers together under pressure to effect a bond between adjacent surfaces of the layers, wherein a press head is employed with a compliant caul for evenly distributing the press force; and permitting said layers to cool to an operating temperature in which said piezoelectric layer is under compressive strain and the titanium layer is under tensile strain.

19 Claims, 5 Drawing Sheets

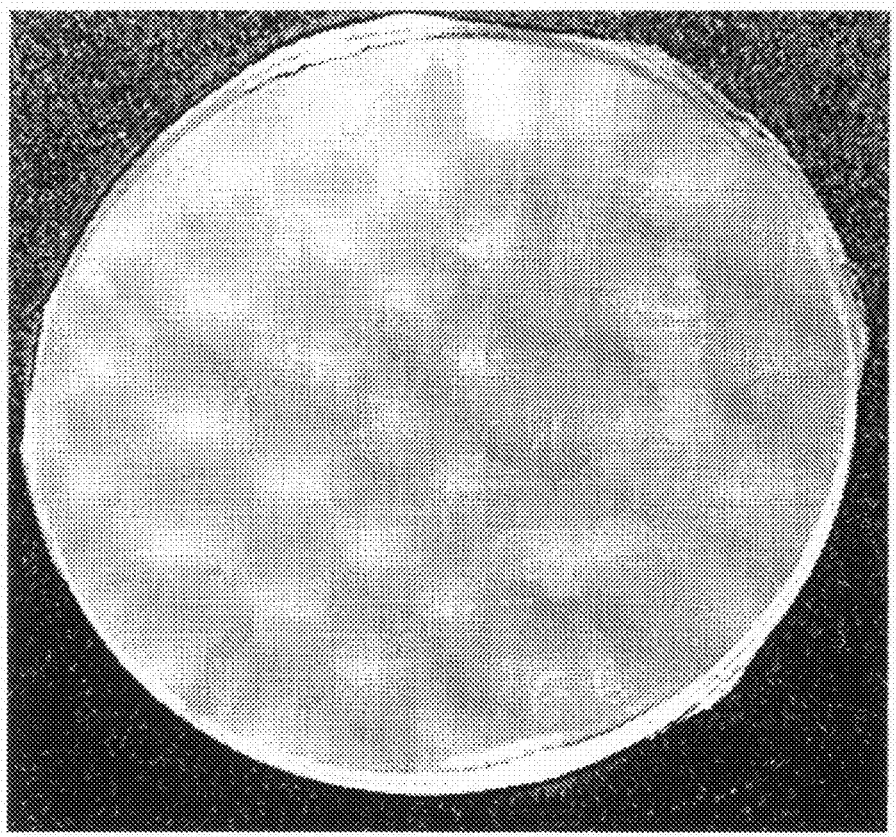
Figure 5
Figure 6
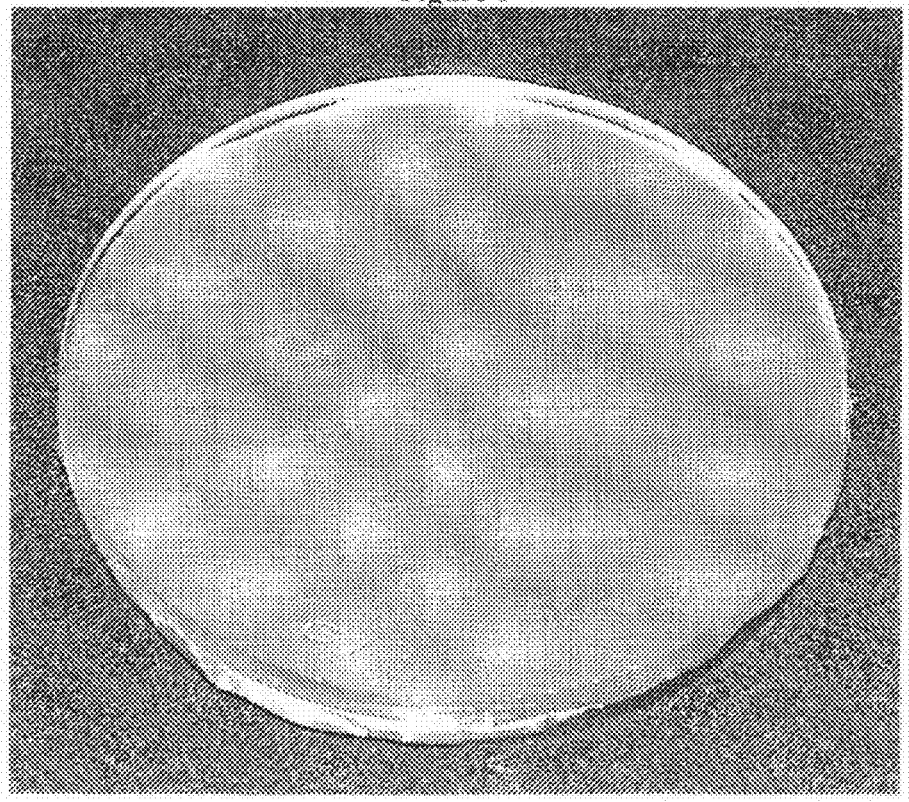

BONDING TOOL AND METHOD

This invention is concerned with a bonding tool and method for bonding together layers of a transducer device, employed in micro-electro-mechanical systems (MEMS) systems.

MEMS devices refer to mechanical and electrical components on the micrometer size. They are typically manufactured using planar processing similar to semiconductor processes. MEMS devices commonly range in size from the order of a micrometer (a millionth of a meter) to the order of a millimeter (thousandth of a metre).

The present invention is concerned with transducers that operate as actuators, where a mechanical movement is created in response to an electromagnetic or other force. The invention is also concerned with transducers that operate as generators where electromagnetic energy is created in response to mechanical movement.

The present invention has application to transducers which may be used as valves to control the flow of gasses and liquids. An example of the application for such a device is the manipulation of airflow about an aircraft wing to promote or delay flow separation to control, for example, vortex bursting thereon. In our co-pending UK patent application no. GB 0420293.3 filed on 10 Sep. 2004 and in our co-pending International (PCT) patent application no. GB05/050147 filed on 8 Sep. 2005 and published as WO2006/027630, there is disclosed a methodology for emitting controlled pulsed jets of air from outlets at or adjacent a leading edge of an aircraft wing.

In our co-pending UK patent application no. GB 0505628.8 filed on 18 Mar. 2005 and in our co-pending International (PCT) patent application no. EP06/060824 filed on 17 Mar. 2006, there is disclosed a method of making a bimorph actuator which comprises assembling and bonding flat outer layers of piezoelectric material such as piezoceramic lead zirconate titanate (PZT) to a flat intermediate reinforcement layer such as Titanium (Ti) while the inner layer is in an expanded condition relative to the outer layers. When all the layers are cooled, a lateral compressive stress develops in the outer layers of piezoelectric material.

The titanium intermediate reinforcing layer or shim may be as wide as 50-100 mm diameter, and of the order of 10-20 microns thick. Although the above method produces good results, it has been found that the method of bonding to PZT layers may under certain circumstances create deformation of the titanium shim, in particular ripples may be formed across its surface from thermally induced stress. This may weaken the bond with the PZT layers.

Improvements are desirable in the bonding process to avoid the possibility of such deformations, and to provide a strong and long-lasting bond.

SUMMARY OF THE INVENTION

The present invention provides in a first aspect a method of bonding together layers of a MEMS transducer device, including a first layer of a piezoelectric material, and a second layer of a metallic material having a thermal coefficient of expansion different from that of the first material, the method comprising the steps of:
 positioning said first layer spaced from the second layer;
 heating said layers to a bonding temperature;
 bringing said layers together under pressure to effect a bond between adjacent surfaces of the layers; and
 permitting said layers to cool to an operating temperature in which the first layer is under compressive strain and the second layer is under tensile strain.

The present invention provides in a second aspect a bonding tool for bonding together layers of a MEMS transducer device, the device including a first layer of a piezoelectric material, and a second layer of a metallic material having a thermal coefficient of expansion different from that of the first material, and the bonding tool comprising:
 positioning means for selectively positioning said layers in a first configuration with said first layer spaced from the second layer, and in a second configuration with said layers in contact for bonding;
 means for heating said layers to a bonding temperature in said first configuration; and
 press means for pressing said layers together in said second configuration to effect a bond between adjacent surfaces of the layers.

In accordance with the invention, deformations in the layers arising from thermally induced stress are avoided, since the layers are heated to a bonding temperature while spaced apart and free to expand. When the layers are ready to be bonded together, they are moved to said second configuration in which the layers are in contact, and a bonding process takes place. Subsequently, said layers are cooled to an operating temperature in which one layer is under compressive strain and the other layer is under tensile strain.

An adhesive bonding layer may be applied as a coating to one or both of the contacting surfaces of the first and second layers. The bonding adhesive may be a material comprising benzocyclobutene, which may be spun onto the surfaces of the piezoelectric layers to a thickness of the order of 1.5 to 2.0 μm. It is preferred to raise the temperature of the layers to about 180° C., and to keep it at that temperature while the bonding operation takes place.

Alternatively, other means of bonding may be employed (eg. Eutectic, direct fusion, thermocompression).

Whilst the invention may have general application to any type of MEMS transducer, it is particularly applicable to unimorph or bimorph piezoelectric structures having a layer of piezoelectric material, comprising one of said layers, bonded to a metallic shim reinforcing layer of steel, copper, or as particularly preferred titanium, comprising the other of said layers. A unimorph structure may have a single layer of piezoelectric material bonded to a single reinforcing shim.

In the case of a bimorph structure, there may be a third layer positioned such that the first layer is sandwiched between the second and third layers. The third and second layers may be formed of a piezoelectric material, whereas said first layer may be formed as a reinforcing metallic shim. In the method of the invention, said third layer is positioned spaced from the first layer during the initial heating phase.

The positioning means may include a plurality of support and spacing members that engage at least the first layer (and the third layer where provided) at positions around the periphery of the layer. The support members are movable between extended and retracted positions, and in the extended position serve to hold the layers apart in said first configuration. In the retracted position, the support members disengage from the first layer (and third layer), permitting the layers to move together under gravity. In an alternative arrangement, a means is provided to positively move the layers together.

Each support member may comprise upper and lower fingers that engage said third and first layers respectively to hold the layers spaced apart. However this may create problems in that the fingers need to be relatively thin in order not to disturb excessively a layer of adhesive that may be disposed on one or more surfaces of the layers, and that the fingers may therefore be bent or deformed under repeated use. In a preferred form therefore each support member comprises a single relatively rigid bar with a thinner slotted formation at its free end to engage the first layer. The slotted formation may be internal of the rigid bar or external, projecting a short distance from the free end of the rigid bar. As regards the third layer, whilst it would be possible in some arrangements for a further slotted formation to engage the third layer, or possibly for the third layer just to engage the top of the rigid bar, it is preferred to provide a support band around the periphery of the third layer to engage the top of the rigid bar, for example an elastomeric O ring, such as a quad ring. When the rigid bar is retracted, the band disengages from the top of the rigid bar, and the third layer falls under gravity on top of the first layer.

A further issue in assuring a smooth uniform contact between the first and second layers is the surface roughness of the layers, which may be significant, and that one or other of the layers may be deformed to an extent out of a flat planar condition. Whilst a certain amount of roughness may be desirable to improve bonding, excessive roughness may harm the bond. More importantly, deformation out of plane may harm the bond.

In accordance with the invention, there is provided a press means for pressing said layers together in said second configuration to effect a bond between adjacent surfaces of the layers, wherein said press means includes a compliant caul member positioned over a press head for contacting said layers during the pressing operation for evenly distributing the press force across the surface of the layers. It has been found that such a caul, consisting for example of a thin layer of fluorelastomer, may significantly improve the quality of the bond over the surface of the layers.

In a third aspect, the invention provides a bonding tool for bonding together layers of a MEMS transducer device, the device including a first layer of a piezoelectric material, and a second layer of a metallic material having a thermal coefficient of expansion different from that of the first material, and the bonding tool comprising:

positioning means for positioning said layers in a configuration with said layers in contact for adhesive bonding;

means for heating said layers to an adhesive bonding temperature in said first configuration; and press means for pressing said layers together in said second configuration to effect a bond between adjacent surfaces of the layers, wherein said press means includes a compliant caul positioned over a press head for contacting said layers during the pressing operation for evenly distributing the press force across the surface of the layers.

BRIEF DESCRIPTION OF THE DRAWINGS

Preferred embodiments of the invention will now be described with reference to the accompanying drawings, wherein:—

FIG. 3 is a cross sectional schematic showing operation of a first embodiment of pzt stack bonding tool, wherein

FIG. 4 is a cross sectional schematic showing operation of a first embodiment of a pzt stack bonding tool, wherein

FIG. 5 shows a MEMS device sample prepared using a prior art bond process: the shim is wrinkled and there are many voids present suggesting a poor quality bond; and FIG. 6 shows a MEMS device sample prepared using the bond process of the invention: the shim is free of wrinkles and no voids are visible.

DESCRIPTION OF THE PREFERRED EMBODIMENTS

Figure 1:
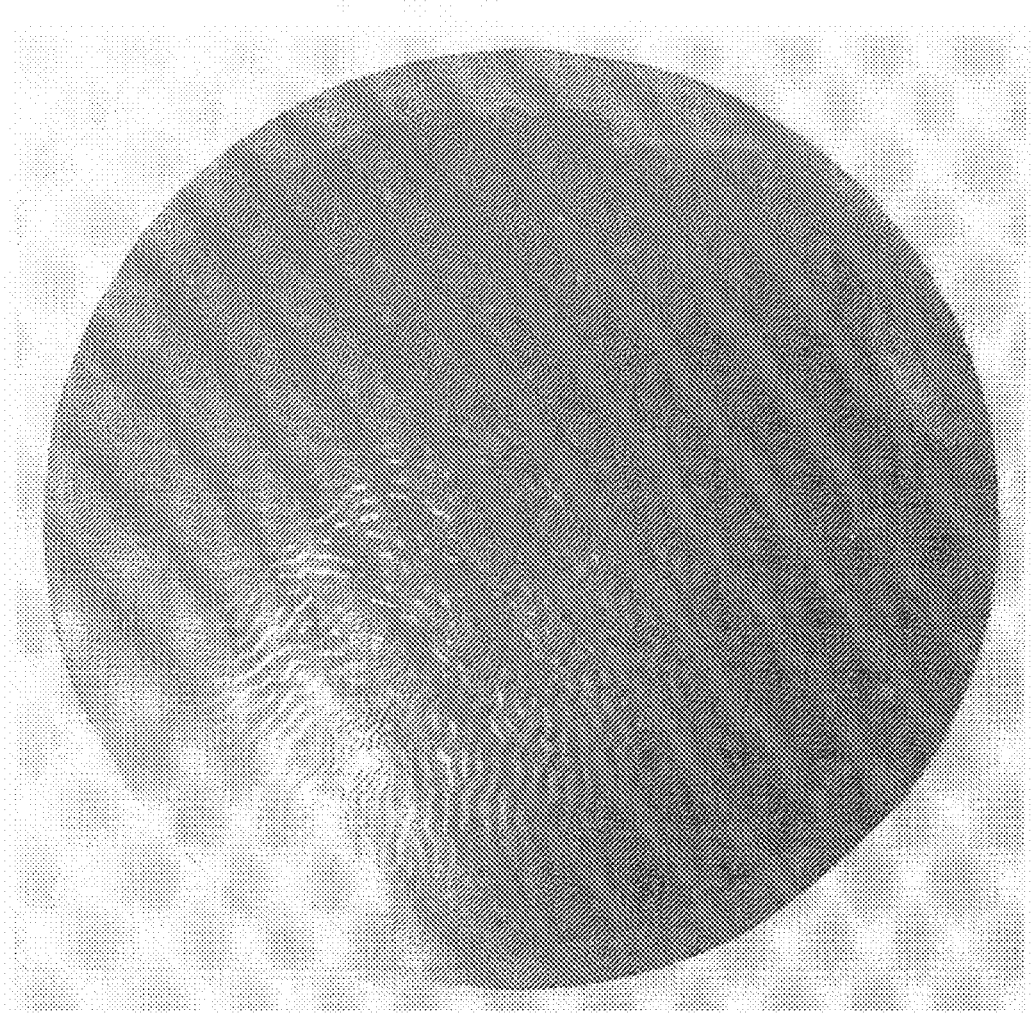
FIG. 1 is a plan view of a 50 mm diameter stainless steel shim showing rippling distortion due to thermally induced stress.

Referring to FIG. 1, this shows a stainless steel shim that has been used in the process according to the above mentioned UK patent application no. GB 0505628.8 filed on 18 Mar. 2005, to make a 50 mm diameter PZT/shim/PZT stack forming a bimorph actuator. The shim is distorted due to its being rigidly clamped between the wafers and unable to expand. As the stack was heated the shim expanded to a greater degree than the PZT and not being free to move, the shim either buckled out of plane or underwent plastic deformation, which resulted in the distortion observed.

Figure 2:
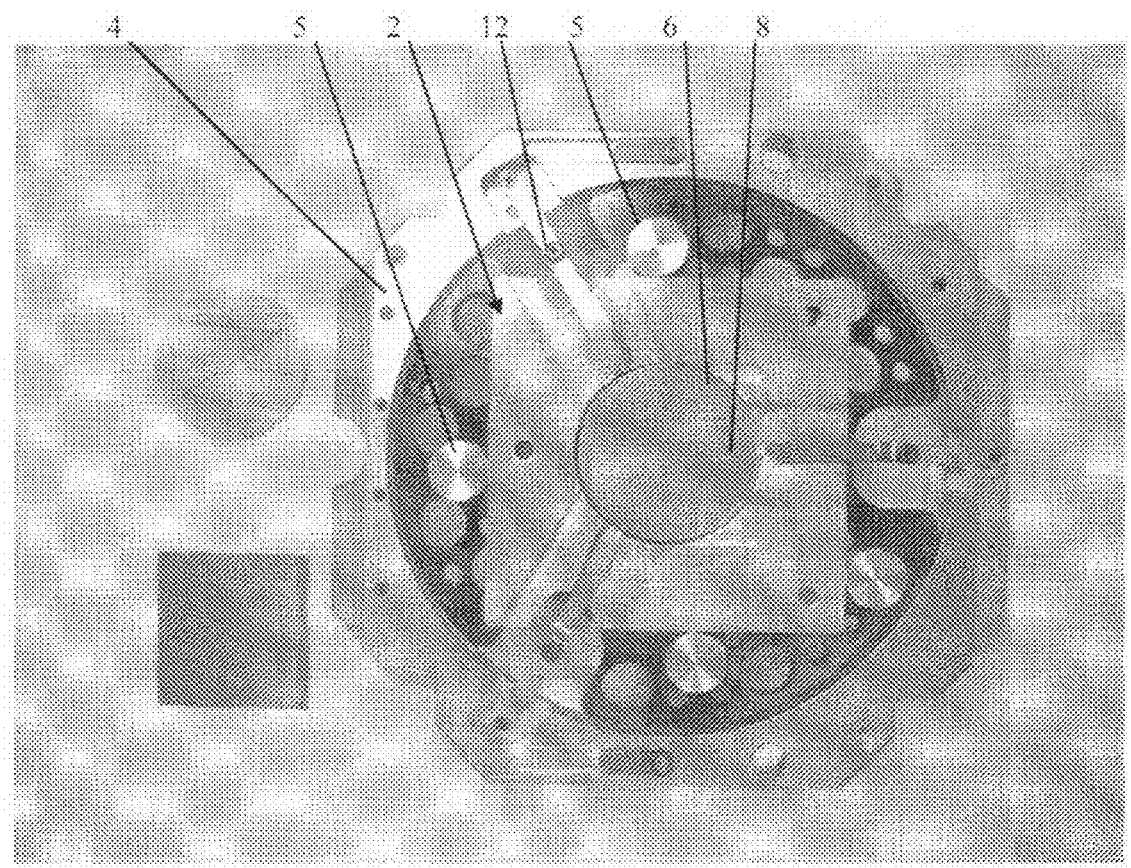
FIG. 2 is a plan view of a 50 mm bonding jig in accordance with the invention with support members comprising long pairs of flags.

Referring to FIGS. 2 and 3, a first embodiment of the invention includes a bonding jig 2. This jig was designed to fit onto a standard 100 mm wafer bonding chuck 4. Four locating pins 5 provide lateral restraint during assembly and flag retraction. A 52 mm diameter circular recess 6 in the jig provided lateral support for a PZT wafer stack 8. Three pairs of supporting retractable flags 12 were provided to the standard separator retraction mechanisms to provide support for the stack. The flags were designed so that once the curing temperature was reached they could be retracted allowing the wafers to come together under gravity. At this point a load was applied to ensure good contact between the layers.

Figure 3A:
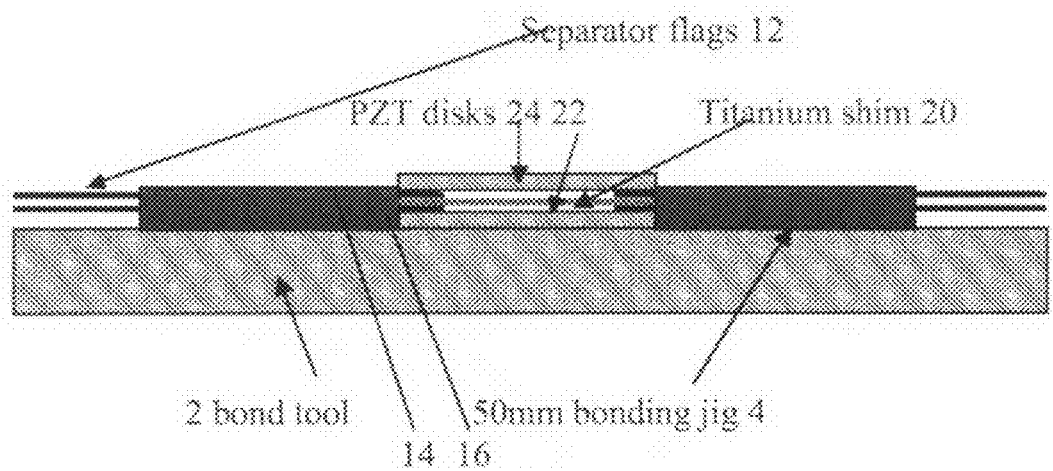
FIG. 3a shows layers of a MEMS device spaced apart during a heating phase.
Figure 3B:
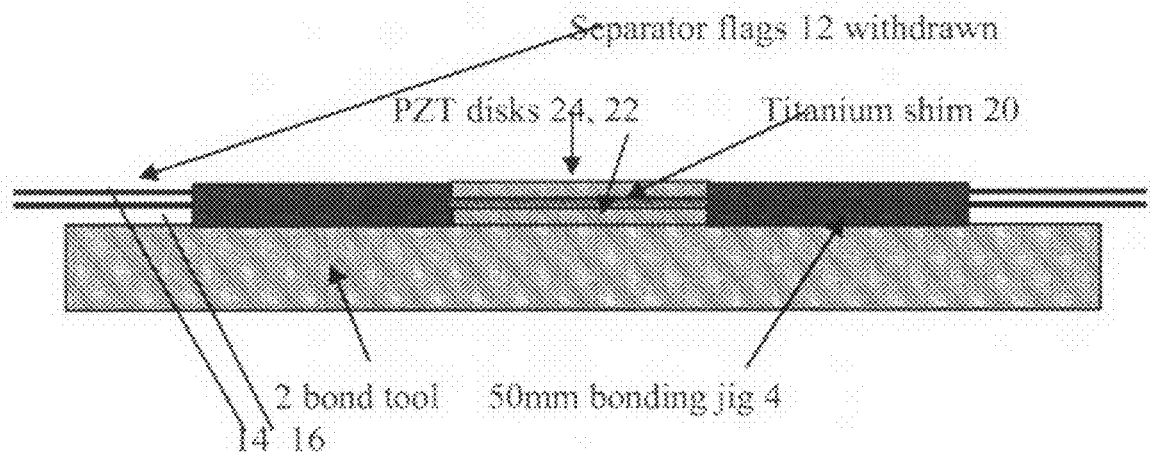
FIG. 3b shows a bonding phase wherein the bonding temperature has been reached, separator flags are withdrawn and the stack comes together.

Referring to FIGS. 3a and 3b, the PZT wafer stack 8 comprises a first layer or shim 20 of titanium and second and third layers 22, 24 are piezoelectric material. Retractable flags 12 comprise an upper finger 14 and a lower finger 16. as shown in FIG. 3a lower finger 16 serves to space first layer 20 from second layer 22 and upper finger 14 serves to space third layer 24 from first layer 20. Faces of the respective layers are coated with a suitable adhesive material for example BCB. In the configuration shown in FIG. 3a, the stack is heated to a bonding temperature of about 250° C. Subsequently, as shown in FIG. 3b, the fingers 12 are withdrawn from the stack, permitting the layers to come together in contact under gravity. A press means (not shown) presses the layer together while the temperature is maintained at curing temperature until the layers are bonded together.

The following example of a bimorph actuator was produced.

EXAMPLE

The actuator comprises a first intermediate reinforcing layer or shim of titanium, bonded to second and third outer layers of piezoelectric material. The piezoelectric material is a piezoceramic material comprising lead zirconate titanate. The intermediate layer may alternatively be stainless steel or copper alloy. Each outer layer of piezoelectric material has a surface flatness of about +/−1 µm and a total thickness of the order of about 20 to 100 µm. Values for the thermal mismatch induced residual stress in the shim 20 showed that titanium would be the most appropriate material for fabrication of the centre vane of the piezoelectric bimorph. A stack was prepared from two 50 mm×2 mm pz26 disks and a 50 mm diameter×12.7 μm section of titanium. The prepared faces of the pzt were first sputter coated with 100 nm nominal chrome films to form the centre electrode of the stack. The pzt disks were spin coated with bcb (benzocyclobutene—see below) and pre-cured to give dry films of approximately 2 μm thickness. The titanium was prepared by rinsing with acetone, isopropyl alcohol and deionised water. This was followed by drying with a nitrogen gun and dehydration at 200° C. for 30 mins. The titanium shims were prepared using a solvent wash followed by treatment with Ar and $O_2$ plasmas. The plasma treatment, whilst effective, was time consuming and tricky to perform so an alternative method was sought. Experimental trials showed that, in the case of titanium, chemical etching in a commercial titanium etchant ($HNO_3$/HF) for 1 minute after solvent washing gave bonds that appeared to be as good as those obtained via the plasma treatment.

An adhesion promoter (dow chemical t1100) was spun on to both sides of the shim. The pzt disks and shim were then loaded into a bonding jig. After the bond chamber was evacuated the sample was heated to 230° C. After withdrawal of the separation flags a load of 875 n was applied and held for 8 hours to cure the adhesive.

BCB resin (Benzocyclobutene) (supplied by Dow Chemical under the trade name Cyclotene) is a spin coatable thermosetting adhesive. It is available is a range of viscosities and can give films between 900 nm and 8 μm thickness in a single application, in addition the polymerisation reaction forms no by-products. After spin coating the adhesive is soft baked at 75° C. for 5 minutes to evaporate the solvent carrier and results in a dry film that presents few handling problems. No significant curing occurs below 150° C. resulting in long shelf life for uncured films. Curing must be carried out in the absence of oxygen to avoid the formation of unwanted secondary phases or total oxidation of the adhesive. Curing may be performed in either a vacuum or an inert ambient. Typical cure times are 8 hours at 180° C. or 1 hour at 250° C. Once fully cured the resin is resistant to most chemical agents and has a maximum use temperature of around 350° C. according to manufacturer's data. We have determined that BCB would potentially have good gap filling properties on rough surfaces.

Second Embodiment

The second embodiment overcomes some issues with regard to the first embodiment. The central locating hole 6 in the tool was too large so the control over the lateral alignment of the disks was poor. The bonded PZT disks could be misaligned by as much as 2 mm, which led to difficulties later on during the grinding process. The overhanging, unsupported sections of the disks could easily become damaged. The second embodiment had a smaller centre hole, which gave much improved lateral alignment between the disks but reduced the tolerance to variations in disk diameter to +/−0.5 mm. The thin, flexible pairs of separation flags 12 of the first embodiment gave poor support in vertical plane. It was possible for the flags to be bent downwards and laterally by the large mass of the PZT disks and this could result in the shim being pinched between them. The shim could then become displaced horizontally when the flags were withdrawn. As previously discussed it is essential to maintain separation between the three components of the stack during the heating phase of the bond process in order to avoid wrinkling of the shim and to impart the required degree of residual stress. The first embodiment supported the wafers directly on the separation flags during the heating phase. It was noted that the flags frequently stuck to the adhesive on disk surfaces causing the process to abort and the run to be lost.

Figure 4A:
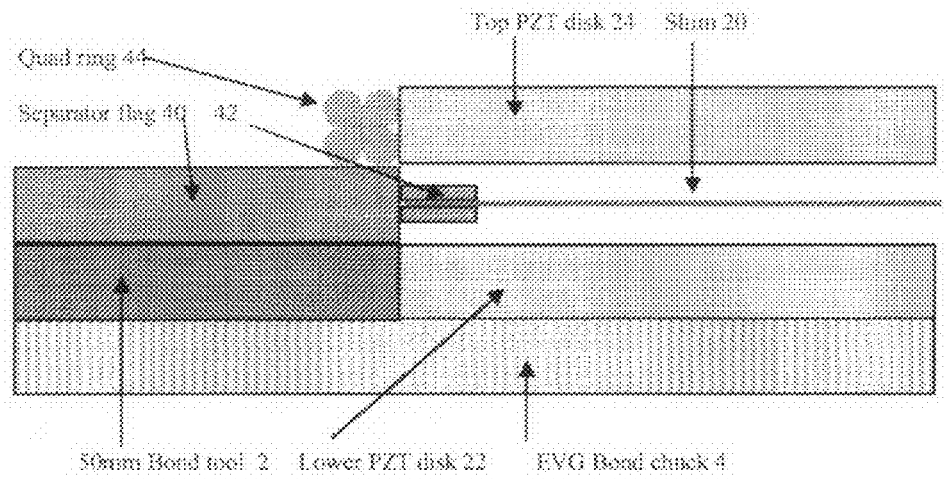
FIG. 4a shows layers of a MEMS device spaced apart during a heating phase.
Figure 4B:
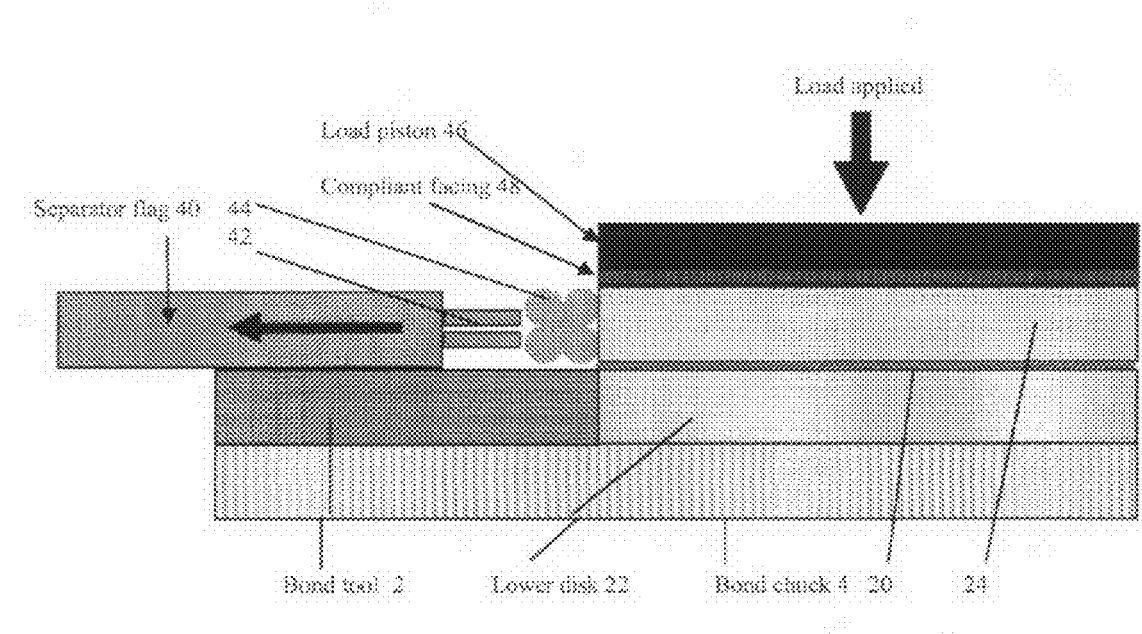
FIG. 4b shows a bonding phase wherein the bonding temperature has been reached, separator flags are withdrawn and the stack comes together.

Referring now to FIGS. 4a and 4b, a second embodiment of the invention is shown, wherein similar parts to those of FIGS. 3a and 3b are denoted by the same reference numeral. A spacing and supporting means comprises three solid support bars 40 positioned around the periphery of the stack 8 and each having a slotted formation 42 projecting from its free end and providing a 100 μm deep horizontal slot which titanium shim 20 is fitted. Since the adhesive is formed on the faces of the piezoelectric layers, this ensured that no contact was made with either adhesive coated face. The third layer 24 has a surrounding quadring 44 (Type 4032 VITON fluoroelastomer. Quad rings are a type of O-ring with a four lobed square cross-sectional profile that prevents them from rolling off). As shown FIG. 4a, the layers of the stack 8 are held in a spaced apart configuration while the stack is heated to a temperature of 180° C. When the bonding temperature is reached, the space bars 40 are withdrawn as shown in FIG. 4b to permit the layer 20, 22, and 24 to come together under gravity. The temperature is maintained whilst a load is applied by a press head 46. A compliant caul 48 is fitted over the press head so as to engage the upper surface of the stack 8 during the bonding process. It had been found that the layers 20-24 had lenticular profiles of the order 4-8 μm height over the 50 mm diameter. For these wafers to form a high quality bond of regular thickness some slight bending would be necessary. As the load was applied between two rigid flat metal plates there was a strong possibility that distortion of this kind could not be achieved resulting in poor closure of the bond line. A controlled compliance was added to the system by use of a fluoroelastomer (VITON) disk of 0.5 mm thickness introduced between bonder load piston and wafer stack. Deformation of this layer gave a more even load distribution on samples that were not perfectly flat and allowed the disks to distort slightly so that the bond line could be closed.

In order to avoid problems of monitoring the stack temperature, a process was derived where the bond chamber was purged with nitrogen at slightly above atmospheric pressure throughout the heating phase. This satisfied the need for an inert atmosphere to prevent oxidation of the BCB and at the same time provided significantly improved thermal coupling between the heater and the bond tool. When used in conjunction with a heater thermocouple this gave tool temperatures that were a close match with that of the heater and a good degree of control. Once the desired temperature was reached the nitrogen purge was shut off and the chamber evacuated. The separator flags were then withdrawn and the load applied as per normal.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention which is defined in the accompanying claims.

The invention claimed is:
1. A method of bonding together layers of a MEMS transducer device, including a first layer of a piezoelectric material, and a second layer of a metallic material having a thermal coefficient of expansion different from that of the first material, the method comprising the steps of:

(a) positioning said first layer spaced from the second layer so that each of the layers can expand freely during heating;
(b) heating said layers to a bonding temperature;
(c) bringing said layers together under pressure to effect a bond between adjacent surfaces of the layers; and
(d) permitting said layers to cool to an operating temperature in which the first layer is under compressive strain and the second layer is under tensile strain.

2. A method according to claim 1, comprising providing bonding adhesive on one or more surfaces of the first and second layers, and heating said layers to an adhesive bonding temperature.

3. A method according to claim 2, wherein said adhesive is Benzocyclobutene (BCB), and said adhesive bonding temperature is about 200° C., preferably 180° C.

4. A method according to claim 2, wherein said heating takes place in an atmosphere depleted of oxygen.

5. A method according to claim 1, wherein said piezoelectric material is PZT, and said metallic reinforcing layer is titanium.

6. A method according to claim 1, comprising:
positioning a third layer, of similar material to said second layer, spaced from said first and second layers;
heating said third layer to a bonding temperature; and
bringing said third layer together with the first and second layers under pressure such that the second layer is sandwiched between the first and third layers, and such that a bond is affected between adjacent surfaces of the layers.

7. A method as claimed in claim 6, wherein the second layer is a metallic reinforcing layer.

8. A method according to claim 2, wherein the bonding adhesive is a thermosetting adhesive.

9. A bonding tool for bonding together layers of a MEMS transducer device, the device including a first layer of a piezoelectric material, and a second layer of a metallic material having a thermal coefficient of expansion different from that of the first material, and the bonding tool comprising:
positioning means for selectively positioning said layers in a first configuration with said first layer spaced from the second layer so that each of the layers can expand freely during heating, and in a second configuration with said layers in contact for bonding;
means for heating said layers to a bonding temperature in said first configuration; and
press means for pressing said layers together in said second configuration to effect a bond between adjacent surfaces of the layers.

10. A tool according to claim 9, wherein the positioning means includes a plurality of support and spacing members that engage the first layer at positions around its periphery.

11. A tool according to claim 10, wherein the support and spacing members are movable between extended and retracted positions, wherein in the extended position they serve to hold the layers apart in said first configuration, and in the retracted position they disengage from the first and second layers, permitting the layers to move together.

12. A tool according to claim 11, wherein each support member comprises at least one finger that serves to hold the first layer spaced from the second layer.

13. A tool according to claim 12, wherein said transducer device includes a third layer, which third layer is of a piezoelectric material, positioned such that the second layer is sandwiched between the first and third layers, and each support member including a second finger that serves to hold the third layer spaced from said second layer.

14. A tool according to claim 10 wherein each support member comprises a single rigid bar with a slotted formation at its free end to engage the said first layer.

15. A tool according to claim 14, wherein said slotted formation projects from the free end of the rigid bar.

16. A tool according to claim 14 including a support band for positioning around the periphery of the third layer, which support band engages the top of the rigid bar when the rigid bar is in said extended position, and disengages from the top of the rigid bar when the rigid bar is in said retracted position, such that the third layer is movable to be in contact with second layer.

17. A tool according to claim 9, wherein said press means includes a compliant caul positioned over a press head for contacting said layers during the pressing operation for evenly distributing the press force across the surface of the layers.

18. A bonding tool for bonding together layers of a MEMS transducer device, the device including a first layer of a piezoelectric material, and a second layer of a metallic material having a thermal coefficient of expansion different from that of the first material, and the bonding tool comprising:
positioning means for positioning said layers in a first configuration with said first layer spaced from the second layer, and in a second configuration with the layers in contact for adhesive bonding;
means for heating said layers to an adhesive bonding temperature in said first configuration; and
press means for pressing said layers together in said second configuration to effect a bond between adjacent surfaces of the layers, wherein said press means includes a compliant caul positioned over a press head for contacting said layers during the pressing operation for evenly distributing the press force across the surface of the layers.

19. A bonding tool according to claim 18, wherein said compliant caul is a layer of elastomeric material.

* * * * *